US010153382B2

(12) United States Patent
Bozler

(10) Patent No.: US 10,153,382 B2
(45) Date of Patent: Dec. 11, 2018

(54) MECHANICAL MEMORY TRANSISTOR

(71) Applicant: Massachusetts Institute of Technology, Cambridge, MA (US)

(72) Inventor: Carl O. Bozler, Waltham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 120 days.

(21) Appl. No.: 14/059,836

(22) Filed: Oct. 22, 2013

(65) Prior Publication Data

US 2014/0077273 A1 Mar. 20, 2014

Related U.S. Application Data

(62) Division of application No. 11/951,535, filed on Dec. 6, 2007, now Pat. No. 8,704,314.

(51) Int. Cl.
*G02B 26/08* (2006.01)
*G09F 9/37* (2006.01)
(Continued)

(52) U.S. Cl.
CPC .............. *H01L 29/84* (2013.01); *B82Y 10/00* (2013.01); *G11C 23/00* (2013.01); *H01L 29/78* (2013.01);
(Continued)

(58) Field of Classification Search
CPC ............ B81B 2201/00; B81B 2201/01; B81B 2201/07; B81B 7/0003; B81B 7/0009;
(Continued)

(56) References Cited

U.S. PATENT DOCUMENTS 4,979,149 A 12/1990 Popovic et al.
5,572,057 A * 11/1996 Yamamoto .......... G01P 15/0802
257/417
(Continued)

OTHER PUBLICATIONS

Kam et al., "A New Nano-Electro-Mechanical Field Effect Transistor (NEMFET) Design for Low-Power Electronics" 2005 IEEE, 4 pages.
(Continued)

*Primary Examiner* — Mary Wilczewski
*Assistant Examiner* — Tsz Chiu
(74) *Attorney, Agent, or Firm* — Gesmer Updegrove LLP

(57) ABSTRACT

A mechanical memory transistor includes a substrate having formed thereon a source region and a drain region. An oxide is formed upon a portion of the source region and upon a portion of the drain region. A pull up electrode is positioned above the substrate such that a gap is formed between the pull up electrode and the substrate. A movable gate has a first position and a second position. The movable gate is located in the gap between the pull up electrode and the substrate. The movable gate is in contact with the pull up electrode when the movable gate is in a first position and is in contact with the oxide to form a gate region when the movable gate is in the second position. The movable gate, in conjunction with the source region and the drain region and when the movable gate is in the second position, form a transistor that can be utilized as a non-volatile memory element.

12 Claims, 19 Drawing Sheets

UP POSITION

DOWN POSITION

(51) Int. Cl.
*G01P 15/08* (2006.01)
*G01P 15/125* (2006.01)
*H01L 29/84* (2006.01)
*B82Y 10/00* (2011.01)
*G11C 23/00* (2006.01)
*H01L 29/78* (2006.01)
*H01H 59/00* (2006.01)
*H01L 29/68* (2006.01)

(52) U.S. Cl.
CPC ........ *H01H 59/0009* (2013.01); *H01L 29/685* (2013.01)

(58) Field of Classification Search
CPC .... H01L 29/84; H01H 59/0009; B82Y 10/00; G11C 23/00
USPC .................................... 257/103, 99
See application file for complete search history.

(56) References Cited

U.S. PATENT DOCUMENTS

| | | | | |
|---|---|---|---|---|
| 5,677,823 | A * | 10/1997 | Smith | G11C 11/50 200/181 |
| 5,818,093 | A | 10/1998 | Gutteridge et al. | |
| 5,874,675 | A * | 2/1999 | Edmans | G01P 15/131 73/514.21 |
| 5,922,212 | A * | 7/1999 | Kano | B81B 3/0072 216/2 |
| 6,441,405 | B1 * | 8/2002 | Smith | G11C 23/00 257/103 |
| 6,509,605 | B1 * | 1/2003 | Smith | G11C 23/00 257/316 |
| 6,645,800 | B2 | 11/2003 | Frey et al. | |
| 6,720,634 | B2 * | 4/2004 | Kang | G01P 15/0802 257/254 |
| 6,844,566 | B2 | 1/2005 | Wasshuber | |
| 6,849,912 | B2 | 2/2005 | Bertz et al. | |
| 7,026,698 | B2 * | 4/2006 | Okumura | B81C 1/00238 257/415 |
| 7,061,660 | B1 * | 6/2006 | Chen | G02B 26/001 257/E31.121 |
| 7,214,995 | B2 | 5/2007 | Chou et al. | |
| 7,288,424 | B2 | 10/2007 | Hunter et al. | |
| 7,495,952 | B2 | 2/2009 | Lal et al. | |
| 7,511,994 | B2 * | 3/2009 | Aritome | G11C 8/10 257/318 |
| 8,030,690 | B2 * | 10/2011 | Ollier | G01P 15/0802 257/254 |
| 8,044,442 | B2 * | 10/2011 | Kam | B82Y 10/00 257/254 |
| 8,336,381 | B2 * | 12/2012 | Kandori | G01C 19/5719 73/504.12 |
| 8,872,240 | B2 * | 10/2014 | Ionescu | H03H 3/0073 257/254 |
| 8,975,669 | B2 * | 3/2015 | Jakovlev | B81B 3/0021 257/254 |
| 9,082,882 | B2 * | 7/2015 | Schelling | H01L 29/66477 |
| 9,450,066 | B2 * | 9/2016 | Song | H01L 29/51 |
| 9,502,300 | B2 * | 11/2016 | Xu | H01L 21/823437 |
| 2002/0005530 | A1 | 1/2002 | Heyers et al. | |
| 2003/0034542 | A1 * | 2/2003 | Okumura | B81C 1/00238 257/508 |
| 2003/0127670 | A1 * | 7/2003 | Kang | G01P 15/0802 257/254 |
| 2004/0238812 | A1 | 12/2004 | Wasshuber | |
| 2005/0067633 | A1 | 3/2005 | Mushika | |
| 2005/0104621 | A1 | 5/2005 | Kawahara et al. | |
| 2005/0227428 | A1 * | 10/2005 | Mihai et al. | 438/222 |
| 2006/0054984 | A1 | 3/2006 | Ancey et al. | |
| 2006/0245034 | A1 | 11/2006 | Chen et al. | |
| 2006/0255395 | A1 * | 11/2006 | Fujita | B82Y 10/00 257/315 |
| 2006/0274470 | A1 | 12/2006 | Srinivasan et al. | |
| 2007/0041142 | A1 | 2/2007 | Lal et al. | |
| 2008/0055976 | A1 | 3/2008 | Aritome | |
| 2008/0093684 | A1 | 4/2008 | Inaba et al. | |
| 2008/0277718 | A1 | 11/2008 | Ionescu et al. | |
| 2010/0237738 | A1 * | 9/2010 | Smith | G11C 23/00 310/309 |

OTHER PUBLICATIONS

Abele et al., Suspended-Gate MOSFET: bringing new MEMS functionality into solid-state MOS transistor 2005 IEEE, 3 pages.
International Search Report and the Written Opinion dated Jul. 15, 2009 in connection with corresponding PCT Application No. PCT/US2008/085654.

* cited by examiner

MECHANICAL MEMORY TRANSISTOR

PRIORITY INFORMATION

This application is a divisional application of U.S. Utility application Ser. No. 11/951,535, filed on Dec. 6, 2007, the contents of which are incorporated herein by reference in its entirety.

SPONSORSHIP INFORMATION

This invention was made with government support awarded by the United States Air Force under Contract No. F19628-95-C-0002. The government has certain rights in the invention.

FIELD AND BACKGROUND

The present invention is directed to a memory switch device for a digital memory device. More particularly, the present invention is directed to a memory switch device that includes a transistor with moving gate which can be move electrically to turn the transistor ON or OFF, thereby enabling the storing of information in a more permanent fashion or the storing of information without requiring power to maintain the stored information.

Examples of conventional devices for digitally storing information are dynamic random access memories and disk drive magnetic memories. A dynamic random access memory stores information electrostatically. Moreover, a dynamic random access memory allows a user to dynamically write to a memory device more than one time so that the contents of the memory can be dynamically changed. Since a dynamic random access memory is a volatile memory, supplemental power is needed for the dynamic random access memory to maintain the stored information.

On the other hand, a disk drive magnetic memory stores information magnetically. A disk drive magnetic memory also allows a user to dynamically write to a memory device more than one time so that the contents of the memory can be dynamically changed. However, since a disk drive magnetic memory is a non-volatile memory, the disk drive magnetic memory does not require supplemental power to maintain the stored information.

As noted above, one disadvantage of a dynamic random access memory is that the dynamic random access memory is volatile. Thus, when the electricity or electric power being supplied to the dynamic random access memory is turned OFF, the contents of the memory are lost. Also, although the disk drive magnetic memory is a non-volatile memory, the use of a disk drive magnetic memory can be a power drain due to the need to keep the disk spinning. Thus, it is desirable to provide a non-volatile memory that has the dynamic characteristics of a dynamic random access memory but does not have the power requirements of a disk drive magnetic memory.

Conventionally, a memory device in the form of a micro-mechanical device has been utilized as an alternative memory to a dynamic random access memory or a disk drive magnetic memory. These conventional micro-mechanical devices are electrical switches which can be fabricated on a semiconductor substrate such as silicon. More specifically, the conventional micro-mechanical device may include a flexible mechanical component under mechanical stress, which has two stable positions.

In the conventional micro-mechanical device, a transition of the mechanical component from one stable position to another stable position can be obtained by overcoming the mechanical spring force in the mechanical component. The mechanical bi-stable operation can be utilized for storing digital electronic signals and information in general. The logic state "0" can be assigned to one of the two stable positions of the mechanical component, and the logic state "1" can be assigned to the other of the two stable positions. The actual determination of the position of the mechanical component can be realized by measuring the capacitance of a capacitor which has the mechanical component formed as one of the capacitor's plates.

A disadvantage of this conventional micro-mechanical device is the need for a separate circuit to measure a capacitance so as to determine the mechanical position and then generate the appropriate voltage to represent the logic state. This additional circuitry slows down the operations of the memory.

Therefore, it is desirable to provide a non-volatile memory that has the dynamic characteristics of a dynamic random access memory but does not have the power requirements of a disk drive magnetic memory. Moreover, it is desirable to provide a non-volatile memory that has a mechanical component which does not negatively impact the speed of the operations of the memory.

A mechanical memory transistor includes a substrate having formed thereon a source region and a drain region; an oxide formed upon a portion of the source region and upon a portion of the drain region; a pull up electrode positioned above such that a gap is formed between the pull up electrode and the substrate; and a movable gate having a first position and a second position, the movable gate being located in the gap between the pull up electrode and the substrate. The movable gate is in contact with the pull up electrode when the movable gate is in the first position, and the movable gate is in contact with the oxide to form a gate region when the movable gate is in the second position. The movable gate, in conjunction with the source region and the drain region and when the movable gate is in the second position, forms a transistor.

A mechanical memory element includes a transistor. The transistor has a substrate having formed thereon a source region and a drain region, an oxide formed upon a portion of the source region and upon a portion of the drain region, a pull up electrode positioned above such that a gap is formed between the pull up electrode and the substrate, and a movable gate having a first position and a second position, the movable gate being located in the gap between the pull up electrode and the substrate, the movable gate being in contact with the pull up electrode when the movable gate is in the first position, the movable gate being in contact with the oxide to form a gate region when the movable gate is in the second position. The mechanical memory element further includes a word line operatively connected to the movable gate; bit sense lines operatively connected to the source region and the drain region; and a bit pull up line operatively connected to the pull up electrode.

A mechanical memory transistor includes a substrate having formed thereon a source region and a drain region; a first pull down electrode positioned on the substrate; a second pull down electrode positioned on the substrate; and a movable gate having a first extension and a second extension, the movable gate having an anchor hinge located between the first and second extensions and located on the substrate between the second pull down electrode and the source and drain regions. The movable gate is in a first position when the first extension of the movable gate is in contact with the second pull down electrode and in a second position when the second extension of the movable gate is in contact with the first pull down electrode. The second extension of the movable gate, in conjunction with the source and drain regions and when the movable gate is in the second position, forms a transistor.

A mechanical memory element includes a transistor. The transistor has a substrate having formed thereon a source region and a drain region, a first pull down electrode positioned on the substrate, a second pull down electrode positioned on the substrate; and a movable gate having a first extension and a second extension, the movable gate having an anchor hinge located between the first and second extensions and located on the substrate between the second pull down electrode and the source and drain regions, the movable gate being in a first position when the first extension of the movable gate is in contact with the second pull down electrode, the movable gate being in a second position when the second extension of the movable gate is in contact with the first pull down electrode. The mechanical memory element further includes a word line operatively connected to the movable gate; bit sense lines operatively connected to the source and drain region; a first bit pull down line operatively connected to the first pull down electrode; and a second bit pull down line operatively connected to the second pull down electrode.

A mechanical memory element includes a transistor. The transistor has a substrate having formed thereon a first source region, a first drain region, a second source region, and a second drain region; a first pull down electrode positioned on the substrate; a second pull down electrode positioned on the substrate; and a movable gate having a first extension and a second extension, the movable gate having an anchor hinge located between the first and second extensions and located on the substrate between the second source and drain regions and the first source and drain regions. The movable gate is in a first position when the first extension of the movable gate is in contact with the first pull down electrode and in a second position when the second extension of the movable gate is in contact with the second pull down electrode. The first extension of the movable gate, in conjunction with the first source and drain regions and when the movable gate is in the first position, forms a first transistor. The mechanical memory element further includes a word line operatively connected to the movable gate; bit sense lines operatively connected to the second source and drain regions and the first source and drain regions; a first bit pull down line operatively connected to the first pull down electrode; and a second bit pull down line operatively connected to the second pull down electrode.

A mechanical memory transistor includes a substrate having formed thereon a first source region, a first drain region, a second source region, and a second drain region; a first pull down electrode positioned on the substrate; a second pull down electrode positioned on the substrate; and a movable gate having a first extension and a second extension, the movable gate having an anchor hinge located between the first and second extensions and located on the substrate between the second source and drain regions and the first source and drain regions. The movable gate is in a first position when the first extension of the movable gate is in contact with the first pull down electrode and in a second position when the second extension of the movable gate is in contact with the second pull down electrode. The first extension of the movable gate, in conjunction with the first source and drain regions and when the movable gate is in the first position, forms a first transistor. The second extension of the movable gate, in conjunction with the second source and drain regions and when the movable gate is in the second position, forms a second transistor.

A mechanical memory transistor includes a substrate having formed thereon a source region and a drain region; an oxide formed upon a portion of the source region and upon a portion of the drain region; a pull up electrode positioned above such that a gap is formed between the pull up electrode and the substrate; a pull down electrode located in the source and drain regions; and a movable gate having a first position and a second position, the movable gate being located in a gap above the pull up electrode and the substrate. The movable gate is in contact with the pull up electrode when the movable gate is in the first position and in contact with the oxide to form a gate region when the movable gate is in the second position. The movable gate, in conjunction with the source and drain regions and when the movable gate is in the second position, forms a transistor.

A mechanical memory element includes a transistor. The transistor has a substrate having formed thereon a source region and a drain region; an oxide formed upon a portion of the source region and upon a portion of the drain region; a pull up electrode positioned above such that a gap is faulted between the pull up electrode and the substrate; a pull down electrode located in the source and drain regions; and a movable gate having a first position and a second position, the movable gate being located in a gap above the pull up electrode and the substrate, the movable gate being in contact with the pull up electrode when the movable gate is in the first position, the movable gate being in contact with the oxide to form a gate region when the movable gate is in the second position. The mechanical memory element further includes a word line operatively connected to the movable gate; bit sense lines operatively connected to the source region and the drain region; a bit pull up line operatively connected to the pull up electrode; and a bit pull down line operatively connected to the pull down electrode.

BRIEF DESCRIPTION OF THE DRAWINGS

The drawings are only for purposes of illustrating preferred embodiments and are not to be construed as limiting, wherein.

DETAILED DESCRIPTION

Figure 1:
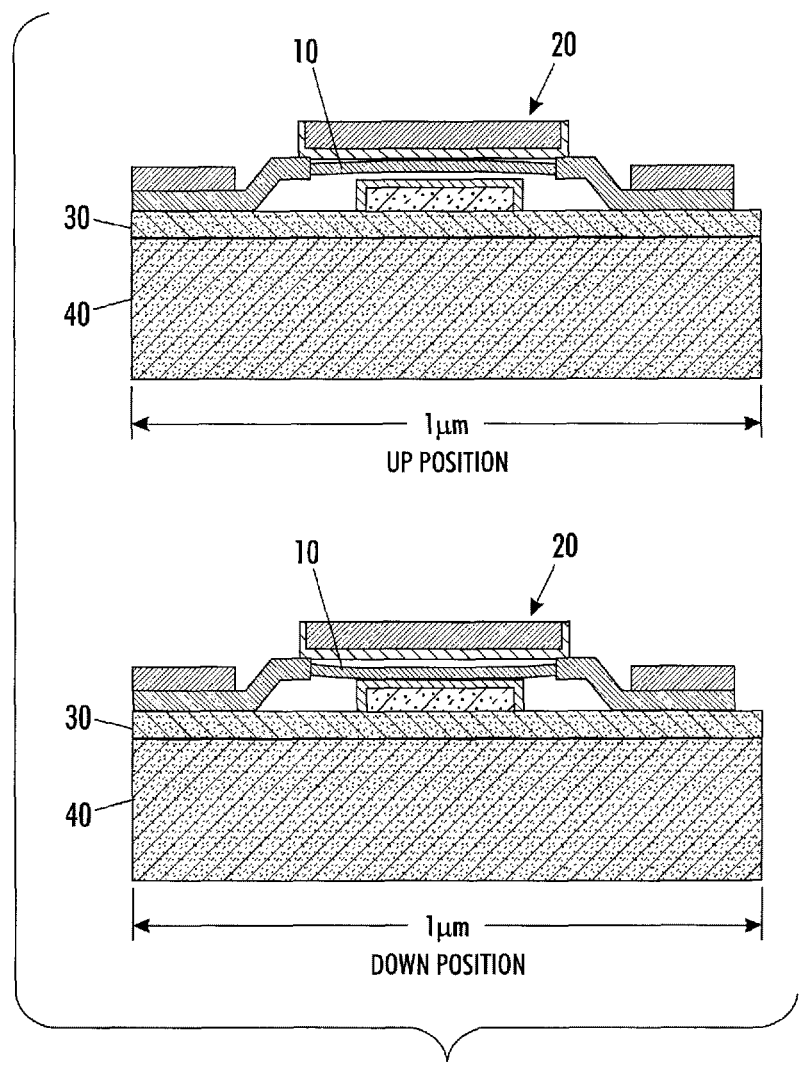
FIGS. 1 and 2 illustrate different views of one embodiment of a mechanical memory transistor.

For a general understanding, reference is made to the drawings. In the drawings, like reference have been used throughout to designate identical or equivalent elements. It is also noted that the various drawings may not have been drawn to scale and that certain regions may have been purposely drawn disproportionately so that the features and concepts could be properly illustrated.

Figure 2:
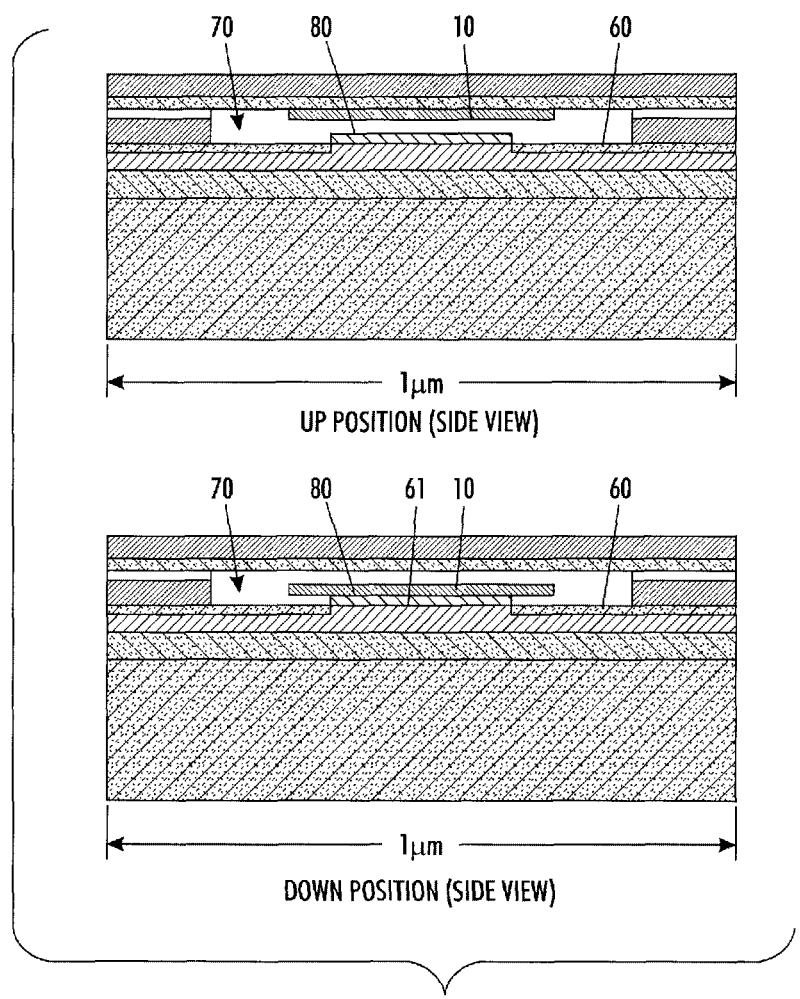

As noted above, FIGS. 1 and 2 illustrate different views of one embodiment of a mechanical memory transistor. As illustrated in FIGS. 1 and 2, the mechanical memory transistor is constructed upon a silicon substrate 40 with an insulating layer 30 of silicon dioxide thereon. The mechanical memory transistor includes a movable gate 10, a source region 70, a drain region 60, and a pull up electrode 20. The movable gate 10 has two stable positions. In the down position (see FIG. 2—when the movable gate 10 is in contact with a gate oxide layer 80), the movable gate 10 can form a MOS transistor. (If the oxide is left out of the design one could also form other similar types of transistors such as a Schottky barrier transistor which would work as a substitute in all of the embodiments to be described.) In this embodiment, the gate oxide layer 80 is formed on the silicon semiconductor body (source region 70 and drain region 60). The pull up electrode 20 may include a coating of an insulating material on it, such as silicon dioxide.

When a voltage is applied to the movable gate 10 (when the movable gate 10 is in the down position) the charge in the semiconductor region is modified such that the transistor is turned ON or OFF. When the movable gate 10 is in the up position, the movable gate 10 contacts the pull up electrode 20. Moreover, when the movable gate 10 is in the up position, there is a gap between the movable gate 10 and the transistor body (source region 70 and drain region 60 and channel region 61; therefore, the movable gate 10 has very little influence on the charge in the transistor body (source region 70 and drain region 60). In other words, when the movable gate 10 is in the up position, voltages applied to the movable gate 10 cannot turn the transistor ON or OFF.

The movable gate 10 is bistable because there is an attractive force between the movable gate 10 and both the pull up electrode 20 and the transistor body (source region 70 and drain region 60). This attractive force varies strongly with distance so that if the movable gate 10 is closer to one or another, the movable gate 10 will move towards the closest of the pull up electrode 20 and the transistor body (source region 70 and drain region 60). Moreover, so long as no other forces acting upon the movable gate 10, the movable gate 10 will remain in either the up position or the down position. By realizing the stability in either the up position or the down position, mechanical memory transistor can be utilized as non-volatile memory device. In other words, when the electricity is turned OFF, the position of the movable gate 10 does not change, and the memory is not lost. It is noted that the movable gate 10 may comprise a material which is attractive to the pull up electrode 20. It is further noted that the movable gate 10 may comprise a material which is attractive to the source region 70 and the drain region 60.

The position of the movable gate 10 can be changed by applying a voltage between the movable gate 10 and either a pull up electrode 20 or between the movable gate 10 and the transistor body (source region 70 and drain region 60). It is noted that the transistor body (source region 70 and drain region 60) may include a pull down electrode (not shown) to provide the necessary voltage to move the position of the movable gate 10. When a certain threshold is reached the movable gate 10 will snap from contact with one area to contact the other area.

When the movable gate 10 is in contact, it may or may not be in intimate contact. The intimacy of the contact will affect the force required to move the gate from one position to another. The contact intimacy will also affect performance of the transistor. Contact is defined as when the gate is nominally within 4 nm of the oxide or transistor body or pull up electrode. Contact intimacy is an important design parameter. There are a number of ways to control contact intimacy including surface smoothness and stops.

Figure 3:
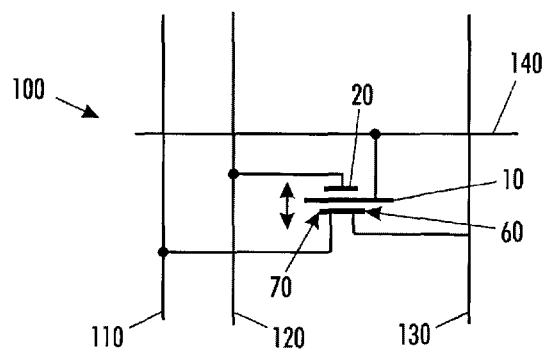
FIG. 3 illustrates an example of a circuit for a mechanical memory transistor array element.

It is noted that the mechanical memory transistor can be utilized in an x-y addressable memory array; such an example is illustrated in FIG. 3. As illustrated in FIG. 3, a mechanical memory element 100 includes a mechanical memory transistor having a source region 70 and drain region 60, a pull up electrode 20, and a movable gate 10. The source region 70 and drain region 60 are connected to bit sense lines 110 and 130, respectively. The pull up electrode 20 is connected to a pull up bit line 120. The movable gate 10 is connected to a word line 140.

To write a bit, a voltage is applied between the word line 140 and one of the bit sense lines 110 and 130 and the bit pull up line 120, depending whether the bit is a one or a zero. The read out is done by applying a voltage to the word line 140, turning ON or OFF the transistor and measuring the current between the sense lines 110 and 130. Depending on the particular design, the presence or lack of current between sense lines will determine a one or a zero.

Figure 4:
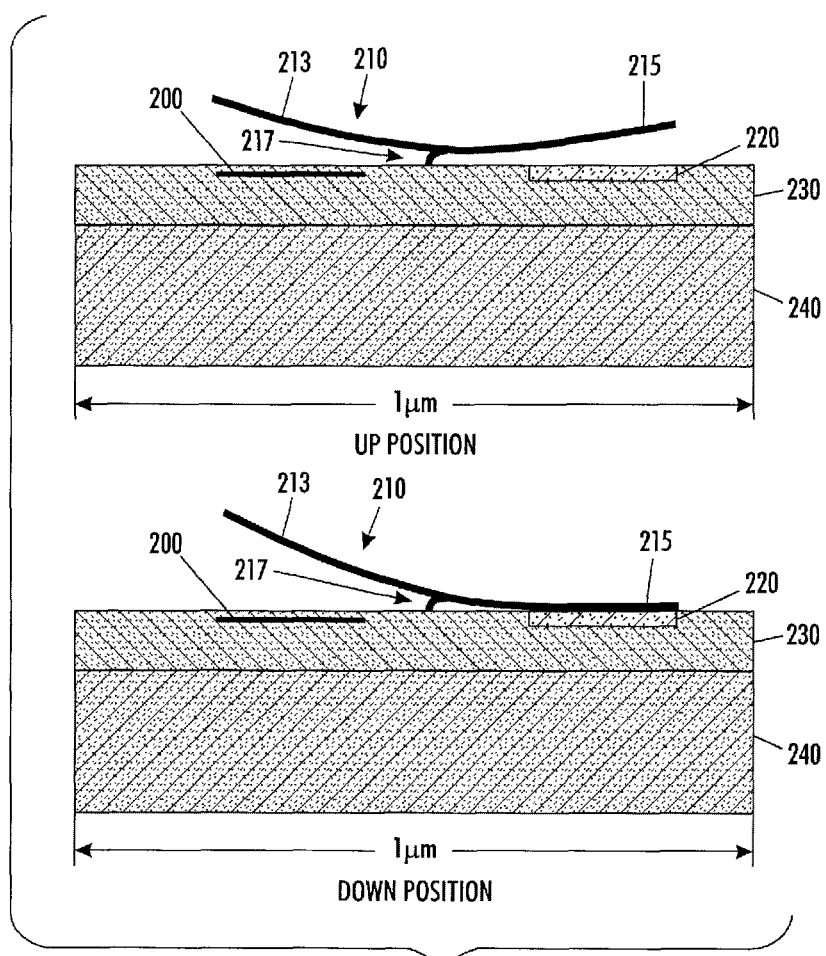
FIGS. 4 and 5 illustrate different views of another embodiment of a mechanical memory transistor.
Figure 5:
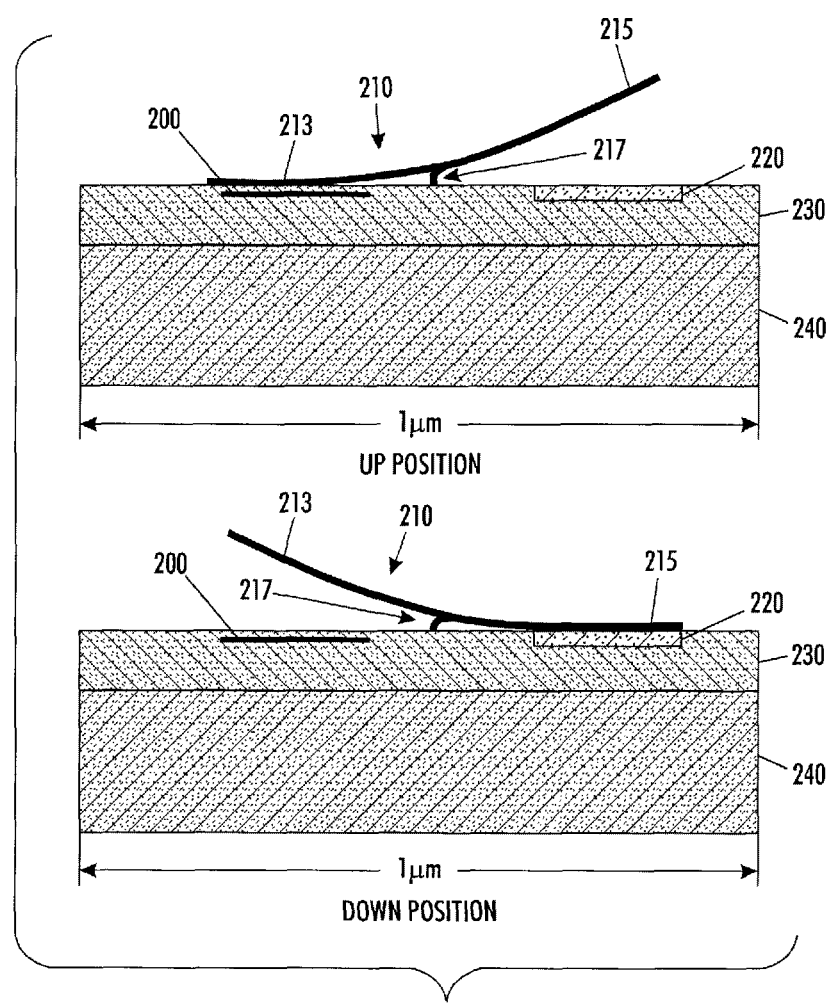

A second embodiment of the mechanical memory transistor is illustrated in FIGS. 4 and 5. As illustrated in FIGS. 4 and 5, the mechanical memory transistor is constructed upon a silicon substrate 240 with an insulating layer 230 of silicon dioxide thereon. The mechanical memory transistor includes a movable gate 210, a source/drain region 220 with a pull down electrode, and a pull down electrode 200. The movable gate 210 has an anchor 217 and two extensions 213 and 215, which enable the movable gate 210 to have three stable positions.

In the down position (see FIG. 4—when the movable gate 210 is in contact with source/drain region 220), the movable gate 210 can form a MOS transistor. In this embodiment, a gate oxide layer may be formed on and between the source/drain region 220. The pull down electrode 200 may also include a coating of an insulating material on it, such as silicon dioxide.

When a voltage applied to the movable gate 210 (when the movable gate 210 is in the down position) the charge in the source/drain region 220 is modified such that the transistor is turned ON or OFF. When the movable gate 210 is in a second up position, as illustrated in FIG. 5, the movable gate 210 contacts the pull down electrode 200. When the movable gate 210 is in a first up position, as illustrated in FIG. 4, the movable gate 210 is in non-contact with the pull down electrode 200 and is in non-contact with the source/drain region 220.

Moreover, when the movable gate 210 is in the first and second up positions, there is a gap between the movable gate 210 and the source/drain region 220; therefore, the movable gate 210 has very little influence on the charge in the source/drain region 220. In other words, when the movable gate 210 is in the first and second up positions, voltages applied to the movable gate 210 cannot turn the transistor ON or OFF.

By realizing the stability in either the two up positions or the down position, the mechanical memory transistor can be utilized as non-volatile memory device. In other words, when the electricity is turned OFF, the position of the movable gate 210 does not change, and the memory is not lost.

The position of the movable gate 210 can be changed by applying a voltage between the movable gate 210 and either a pull down electrode 200 or the source/drain region 220. In this embodiment, the movable gate 210 has a rocking motion with the pull down electrode 200 off to the side. This geometry may be easier to fabricate than the device having a pull up electrode directly above, as illustrated in FIGS. 1 and 2.

As illustrated in FIGS. 4 and 5, the movable gate 210 is positioned in an air gap above the insulating layer 230.

Figure 6:
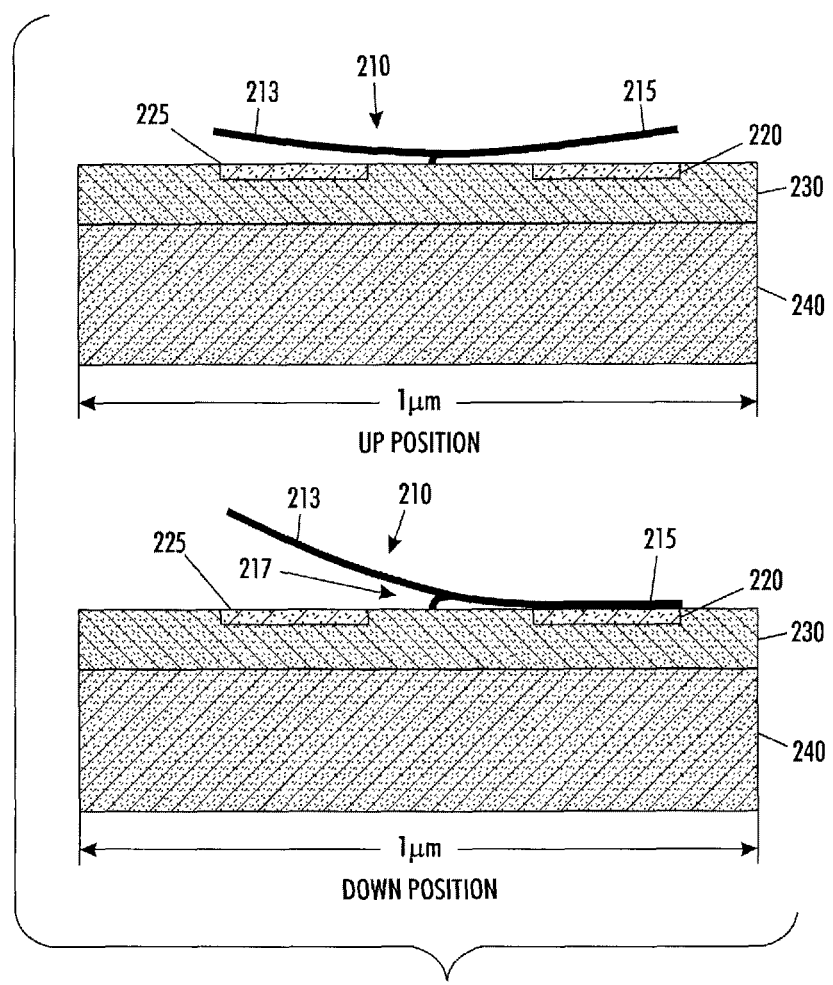
FIGS. 6 and 7 illustrate different views of a third embodiment of a mechanical memory transistor.
Figure 7:
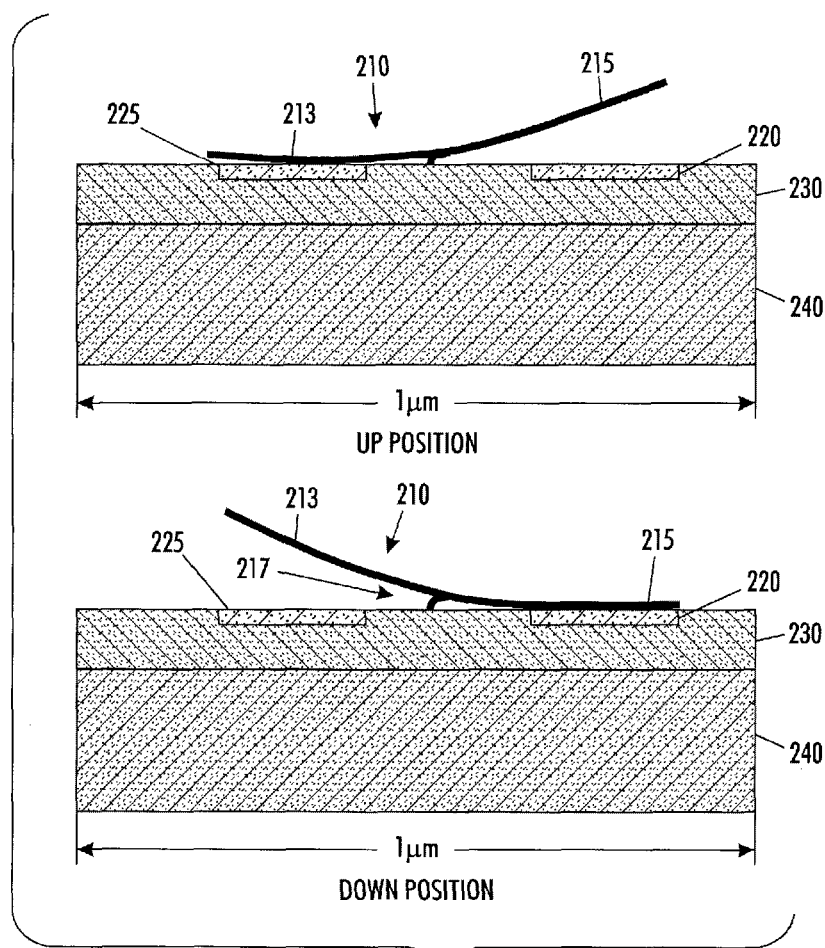

In another embodiment, as illustrated in FIGS. 6 and 7, a mechanical memory transistor is formed on both sides of the anchor 217. As illustrated in FIGS. 6 and 7, the mechanical memory transistor is constructed upon a silicon substrate 240 with by an insulating layer 230 of silicon dioxide thereon. The mechanical memory transistor includes a movable gate 210, a first source/drain region 220 with an optional pull down electrode, and a second source/drain region 225 with an optional pull down electrode. The optional pull down electrode can be the transistor body itself. The movable gate 210 has an anchor 217 and two extensions 213 and 215, which enable the movable gate 210 to have three stable positions.

In a first down position (see FIG. 6—when the movable gate 210 is in contact with first source/drain region 220), the movable gate 210 can form a MOS transistor. In this embodiment, a gate oxide layer may be formed on the first source/drain region 220. When a voltage applied to the movable gate 210 (when the movable gate 210 is in the down position) the charge in the first source/drain region 220 is modified such that the transistor is turned ON or OFF.

In a second down position (see FIG. 7—when the movable gate 210 is in contact with second source/drain region 225), the movable gate 210 can form a MOS transistor. In this embodiment, a gate oxide layer may be formed on the source/drain region 225. When the movable gate 210 is in a second down position, as illustrated in FIG. 7, the movable gate 210 contacts the second source/drain region 225. When the movable gate 210 is in an up position, as illustrated in FIGS. 6 and 7, the movable gate 210 is in non-contact with the first source/drain region 220 and is in non-contact with the second source/drain region 225.

Moreover, when the movable gate 210 is in the up position, there is a gap between the movable gate 210 and the first source/drain region 220 and a gap between the movable gate 210 and the second source/drain region 225; therefore, the movable gate 210 has very little influence on the charge in the first source/drain region 220 or the second source/drain region 225. In other words, when the movable gate 210 is in the up position, voltages applied to the movable gate 210 cannot turn the transistor(s) ON or OFF.

By realizing the stability in the two down positions or the up position, the mechanical memory transistor can be utilized a single pole double throw switch. The position of the movable gate 210 can be changed by applying a voltage between the movable gate 210 and either source/drain regions. As illustrated in FIGS. 6 and 7, the movable gate 210 is positioned in an air gap above the insulating layer 230.

Figure 8:
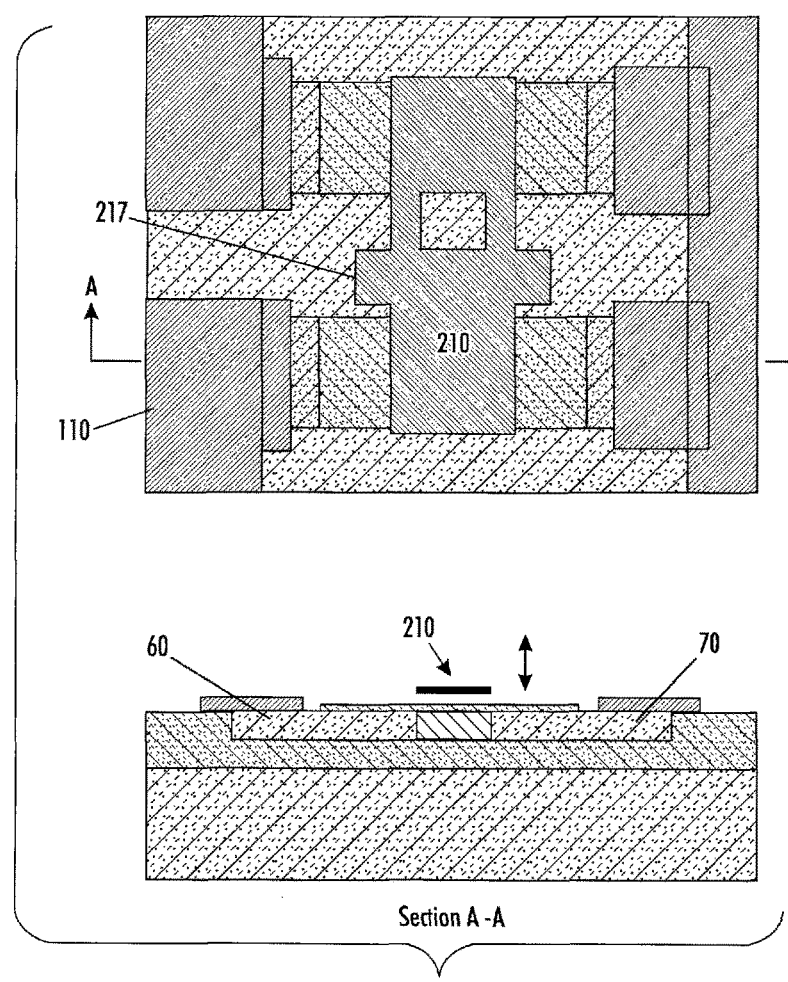
FIG. 8 illustrates a top view of the third embodiment of a mechanical memory transistor illustrated in FIGS. 6 and 7.

FIG. 8 illustrates a top view of the mechanical memory transistor illustrated in FIGS. 6 and 7. As illustrated in FIG. 8, the movable gate 210 can rock between the source/drain regions, pivoting on anchor 217. The source/drain regions are connected to bit sense lines 110.

It is noted that the anchor 217 can be segmented into three to allow the movable gate 210 to be made from one metal layer.

Figure 9:
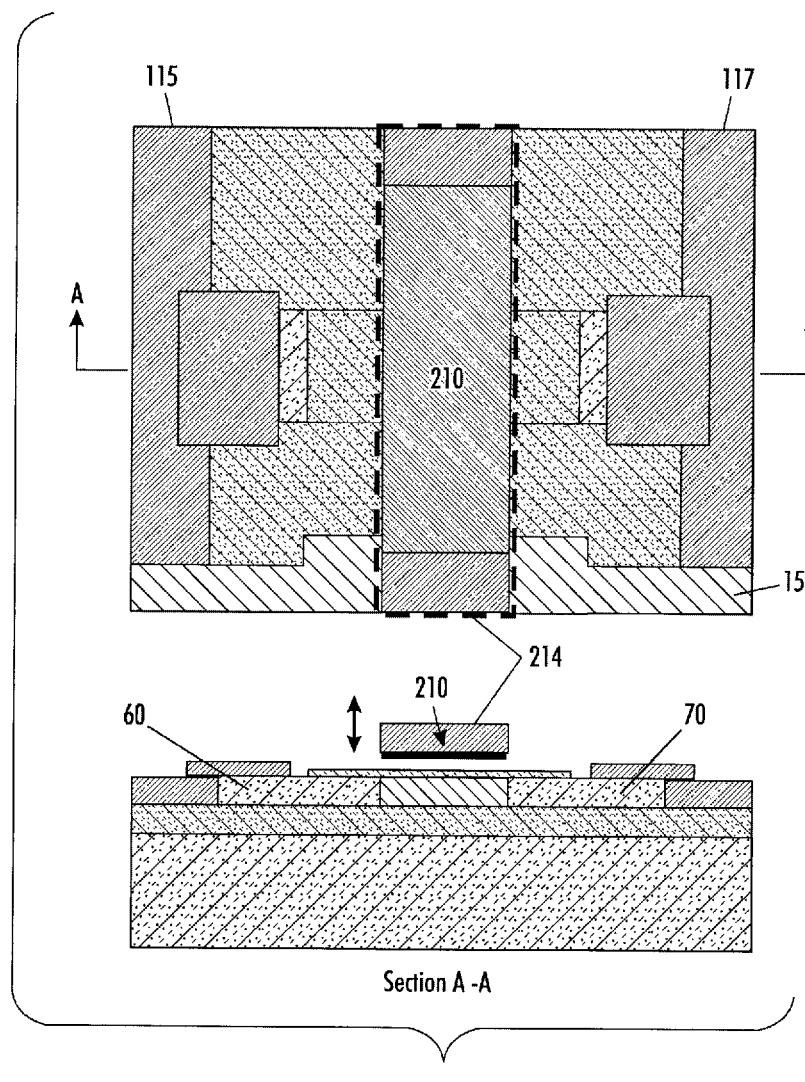
FIGS. 9 and 10 illustrate different views of a fourth embodiment of a mechanical memory transistor.

FIG. 9 is a top view and cross section of a more detailed design of the memory elements, illustrated in FIGS. 1-3, showing the address lines used in a memory array. As illustrated in FIG. 9, a movable gate 210 is bridged over a source(70)/drain(60) region. The source region 70 is connected to bit sense line 115, and the drain region 60 is connected to bit sense line 117. The movable gate 210 is positioned using the pull up electrode 214. The movable gate 210 is connected to the word line 150.

Figure 10:
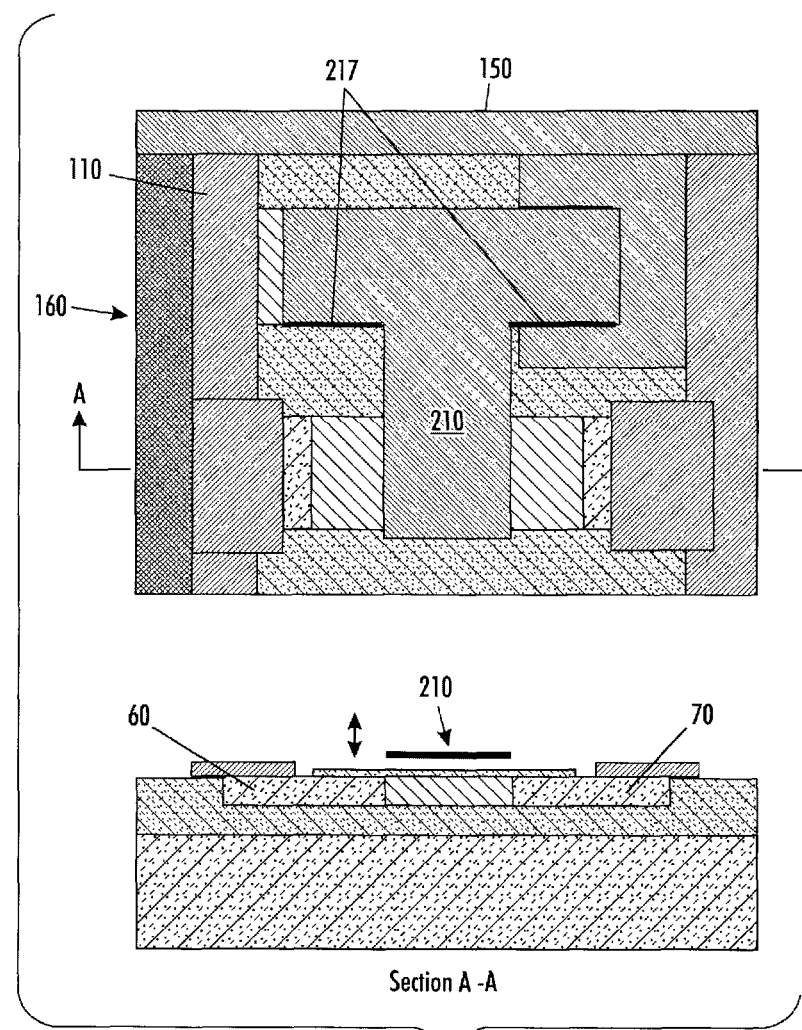

FIG. 10 is a top view and cross section of a more detailed design of the memory elements, illustrated in FIGS. 4-7, showing the address lines used in a memory array. As illustrated in FIG. 10, a movable gate 210 is cantilevered over a source(70)/drain(60) region and a pull down electrode, which is connected to a bit pull down line 160. The movable gate 210 is connected to the word line 150.

Figure 11:
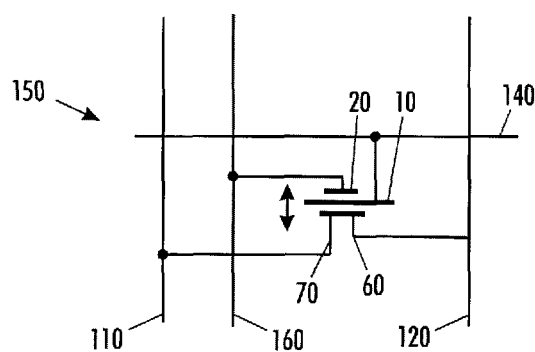
FIG. 11 illustrates another example of a circuit for a mechanical memory transistor array element.

As illustrated in FIG. 11, a mechanical memory element 150 includes a mechanical memory transistor having a source region 70 and drain region 60, a pull down electrode 20, and a movable gate 10. The source region 70 and drain region 60 are connected to bit sense lines 110 and 120, respectively. The pull up electrode 20 is connected to a pull down bit line 160. The movable gate 10 is connected to a word line 140.

Figure 12:
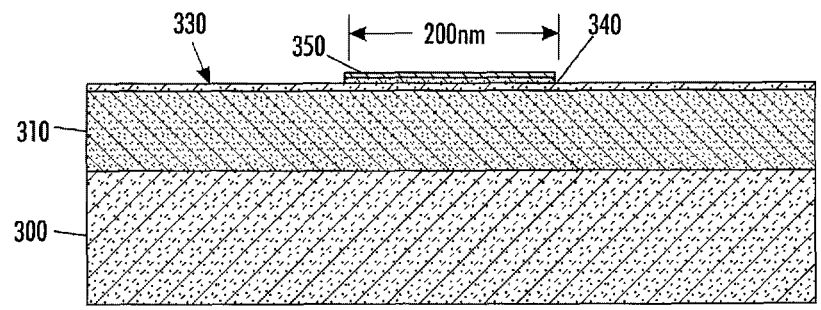
FIGS. 12 through 20 illustrate an example of the fabrication of a mechanical memory transistor.
Figure 13:
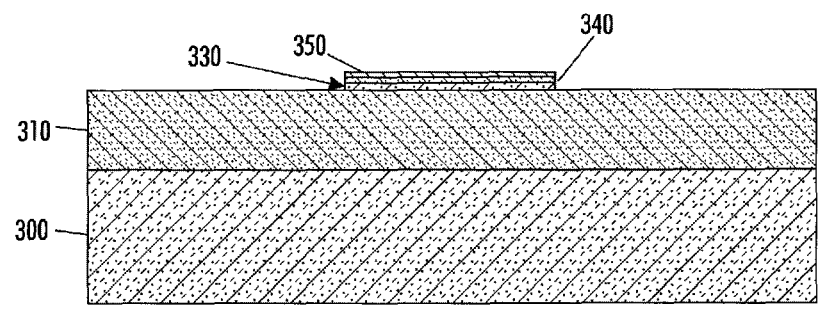
Figure 14:
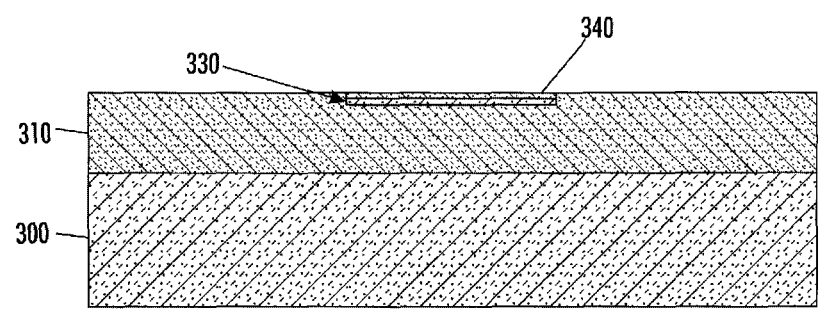

FIGS. 12 through 20 illustrate an example of the fabrication of a mechanical memory transistor. As illustrated, the fabrication of a mechanical memory transistor begins with, as illustrated in FIG. 12, the formation of silicon on insulator 330 (SOI) upon silicon dioxide 310, which is formed upon silicon 300. Upon the silicon on insulator 330, another layer of silicon dioxide 340 is formed. Upon the layer of silicon dioxide 340, $Si_3N_4$ 350 is formed. In FIG. 13, the silicon on insulator 330 is etched, followed by a silicon oxide deposition, as illustrated in FIG. 14. The embedded silicon (SOI) 330 will become the transistor body. The source and drain contacts are added (not illustrated) using ion implantation.

Figure 15:
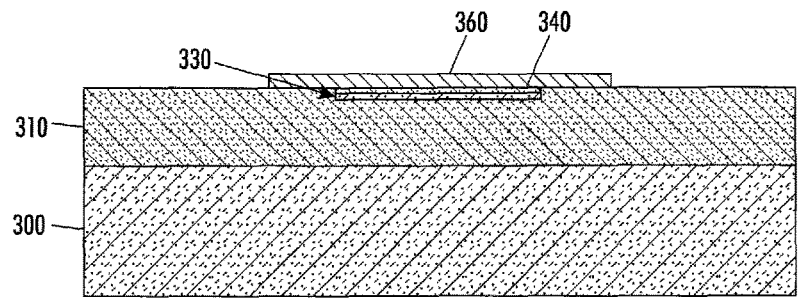
Figure 16:
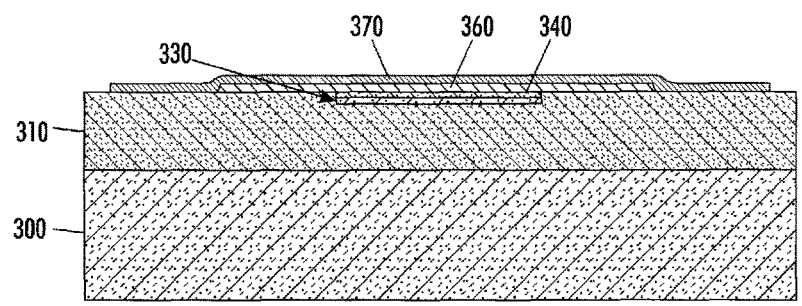
Figure 17:
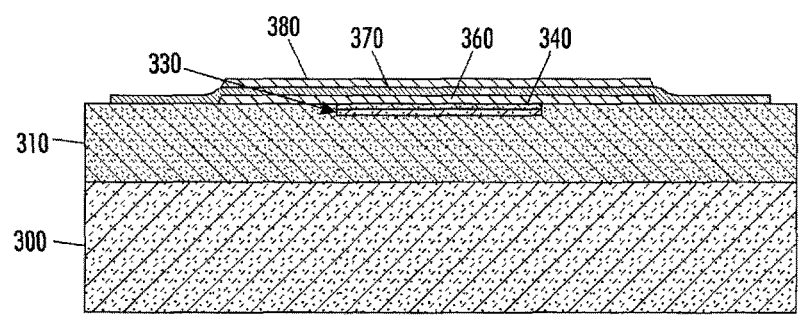
Figure 18:
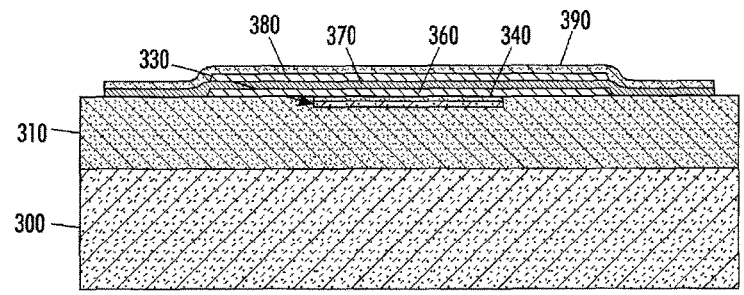
Figure 19:
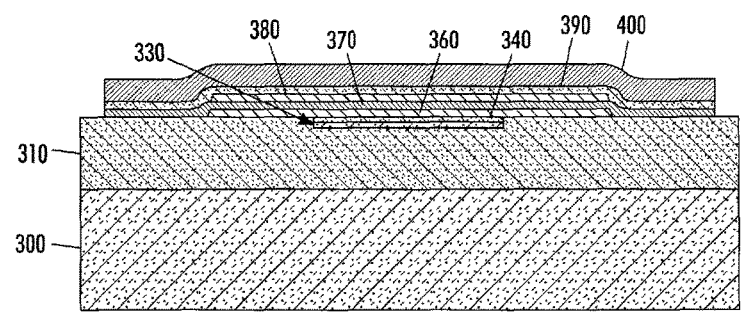
Figure 20:
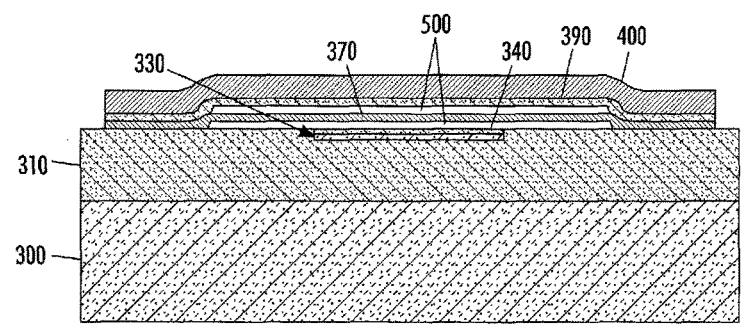

In FIG. 15, a first release layer 360, for example molybdenum, is applied and patterned. The moving gate 370, for example aluminum, is applied and patterned in FIG. 16. A second release layer 380 is applied in FIG. 17. An oxide layer 390 is grown, as illustrated in FIG. 18. A heavier aluminum layer 400 is then grown over the oxide and both the aluminum 400 and the oxide 390 are patterned, as illustrated in FIG. 19. In FIG. 20, the release layers (360 and 380) are removed to form an air gap 500. The release layers (360 and 380) can be removed, for example by etching with hydrogen peroxide, and dried, for example in a critical point dryer. The moving gate structure is now complete, and external contacts to the source and drain, moving gate and pull up electrode are formed using conventional processes and depending on the circuit design.

Figure 21:
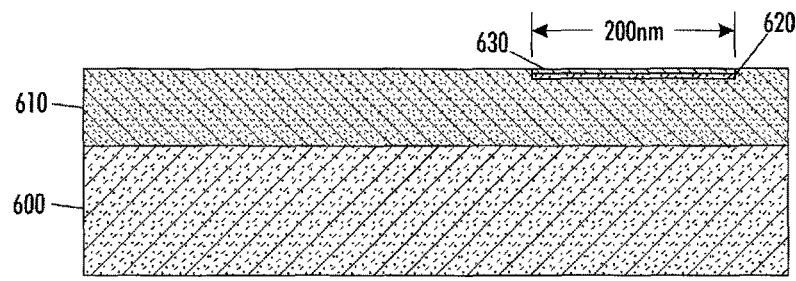
FIGS. 21 through 25 illustrate another example of the fabrication of a mechanical memory transistor.
Figure 22:
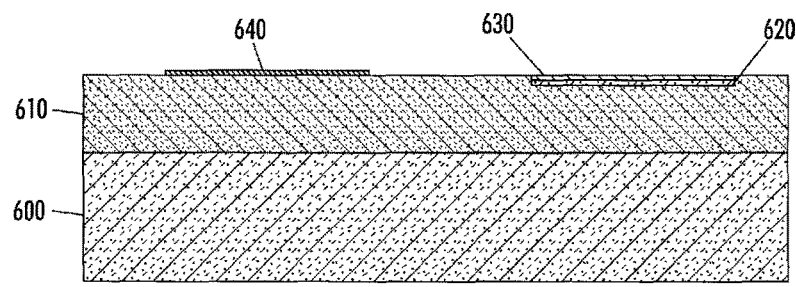
Figure 23:
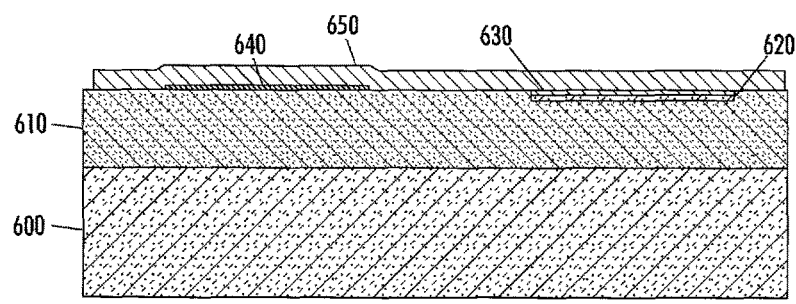
Figure 24:
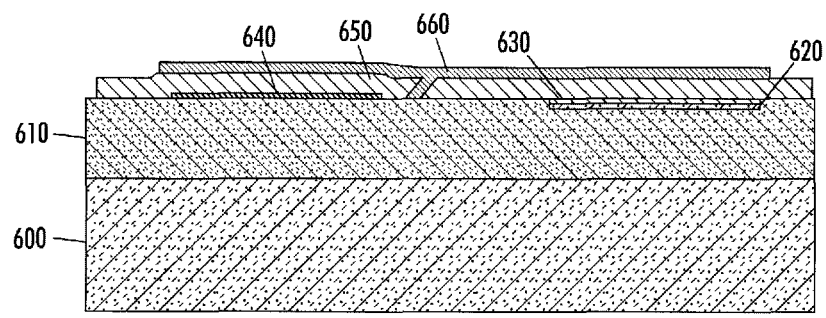
Figure 25:
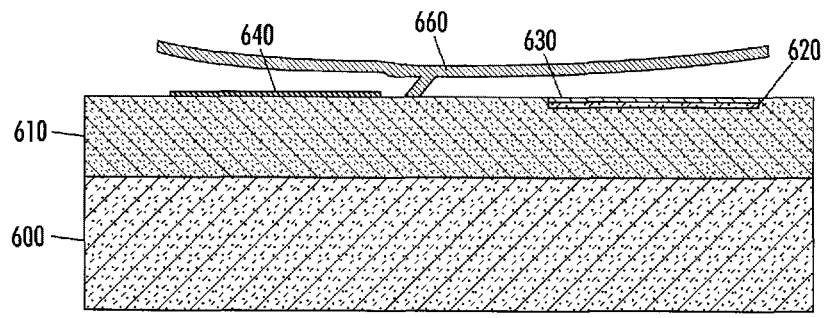

FIGS. 21 through 25 illustrate another example of the fabrication of a mechanical memory transistor. FIG. 21 illustrates the same stage as illustrated in FIG. 14 of the previous process (silicon on insulator 620 (SOI) upon silicon dioxide 610, which is formed upon silicon 600; upon the silicon on insulator 620, another layer of silicon dioxide 630 is formed). The source and drain contacts are added (not illustrated) using ion implantation. In FIG. 22, an aluminum film 640 is deposited and patterned. In FIG. 23, a release layer 650, for example molybdenum, is deposited and patterned. In FIG. 24, the gate layer 660 is deposited, for example aluminum, and patterned. The gate layer 660 is released, as illustrated in FIG. 25, by etching the release layer 650 as before.

Figure 26:
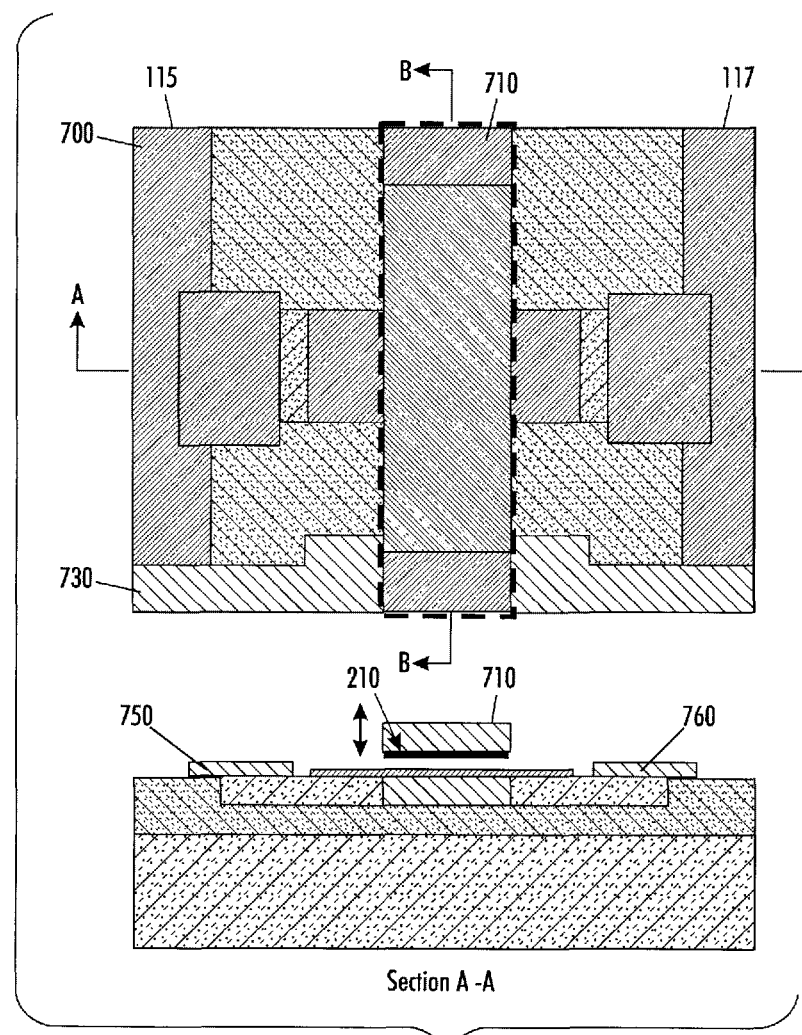
FIGS. 26 and 27 illustrate different views of another embodiment of a mechanical memory transistor.
Figure 27:
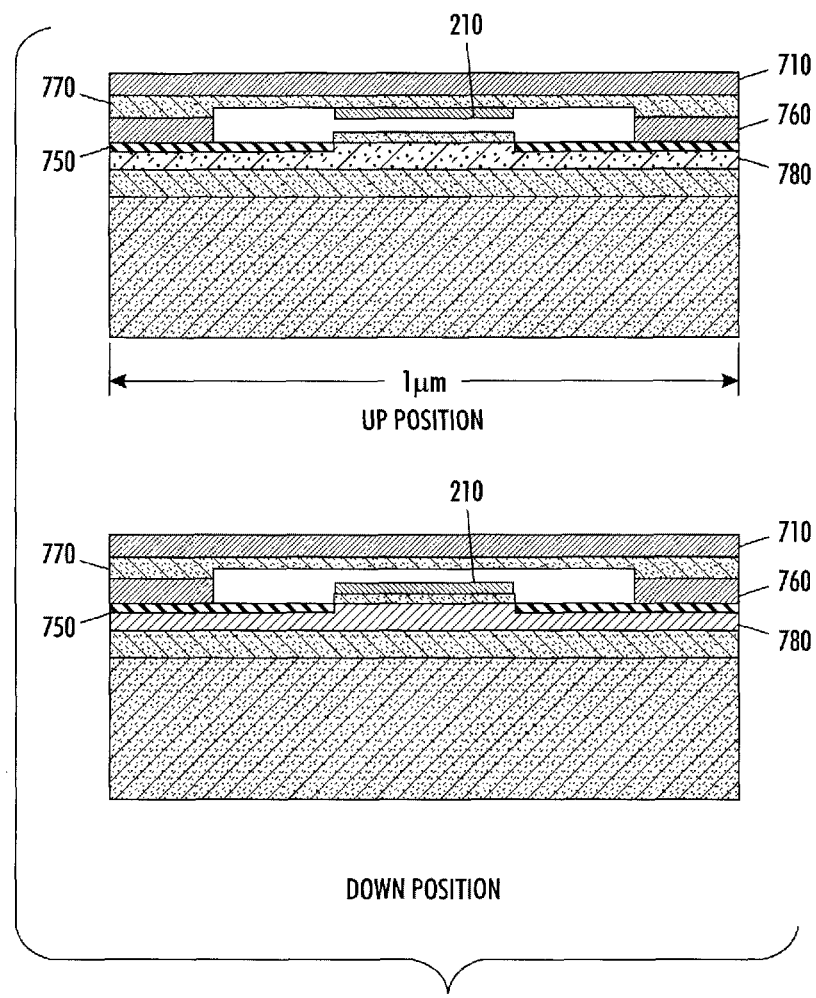
Figure 28:
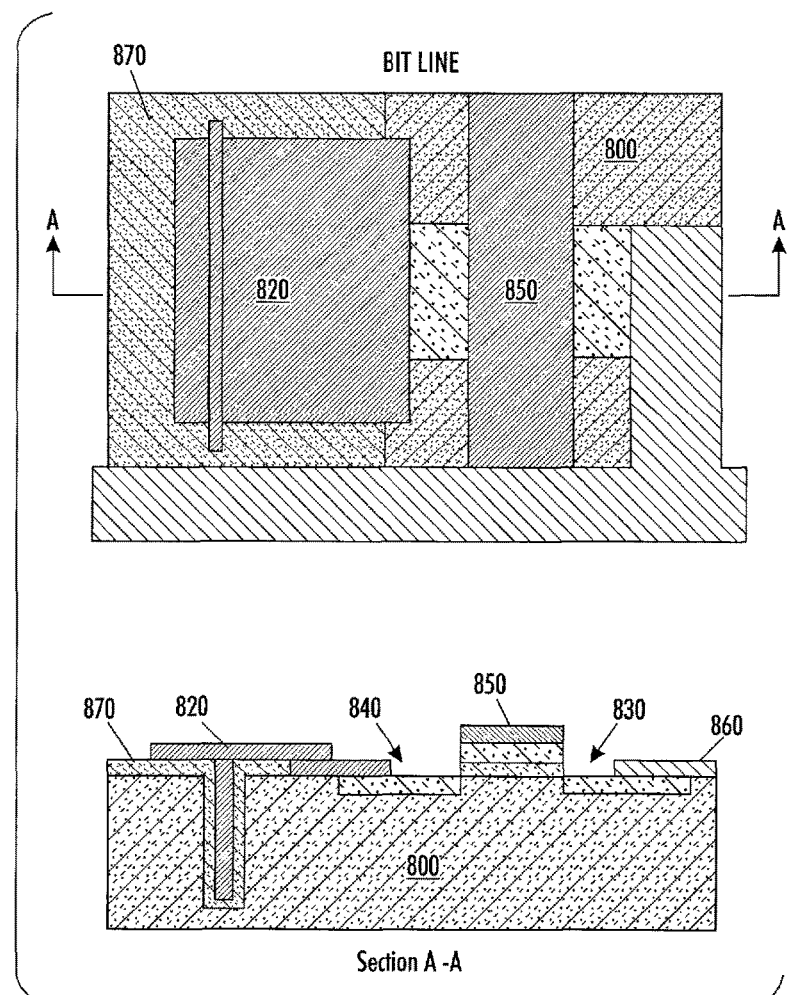
FIG. 28 illustrates a conventional memory element of a dynamic random access memory.

FIGS. 26 and 27 illustrate different views of another embodiment of a mechanical memory transistor, and FIG. 28 illustrates a conventional memory element of a dynamic random access memory.

FIGS. 26 and 27 illustrate a top view and cross section of a more detailed design of a mechanical memory element 700, showing the address lines used in a memory array. As illustrated in FIGS. 26 and 27, a movable gate 210 is bridged over a source (750)/drain(760) region. The source region 750 is connected to bit sense line 115, and the drain region 760 is connected to bit sense line 117. The movable gate 210 is positioned using the pull up electrode 710. The movable gate 210 is connected to the word line 730. The mechanical memory element 700 may include an oxide layer 770 on the pull up electrode 710. The source region 750 and the drain region 760 are formed on the silicon on insulator layer 780.

FIG. 28 illustrates a memory element 800 of a dynamic random access memory. The memory element 800 includes a capacitor formed of layers 820 and 870, a source 840, a drain 830, and a gate 850. The drain 830 is connected to a bit line 860. All of this is formed upon a silicon substrate 800.

As illustrated in FIGS. 26-28 a comparison between a mechanical memory transistor (FIGS. 26 and 27) and the memory element of a dynamic random access memory (FIG. 28) realizes that the area of the elements are very similar. Therefore, the memory densities will be similar. The memory density, of course, translates directly into memory cost per bit.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. A mechanical memory transistor, comprising:
   a substrate having formed thereon a source region and a drain region;
   said source region having a first source region portion and a second source region portion;
   said drain region having a first drain region portion and a second drain region portion;
   a gate oxide formed upon said first source region portion and upon said first drain region portion;
   said gate oxide not being formed upon said second source region portion;
   said gate oxide not being formed upon said second drain region portion;
   a pull up electrode positioned above said substrate such that a gap is formed between said pull up electrode and said gate oxide; and
   a movable gate having a first position and a second position, said movable gate being located in said gap between said pull up electrode and said gate oxide;
   said movable gate contacting said pull up electrode when said movable gate is in said first position;
   said movable gate being moved to said first position when a voltage is applied between said pull up electrode and said movable gate;
   said movable gate remaining in said first position after the voltage being applied between said pull up electrode and said movable gate is terminated;
   said movable gate remaining in said first position until a voltage is applied between said substrate and said movable gate;
   said movable gate contacting said gate oxide when said movable gate is in said second position;
   said movable gate being moved to said second position when the voltage is applied between said substrate and said movable gate;
   said movable gate remaining in said second position after the voltage being applied between said substrate and said movable gate is terminated;
   said movable gate remaining in said second position until the voltage is applied between said pull up electrode and said movable gate;
   said movable gate, in conjunction with said source region and said drain region and when said movable gate is in said second position, forming a transistor.

2. The mechanical memory transistor as claimed in claim 1, wherein said movable gate comprises a material which is attractive to said pull up electrode.

3. The mechanical memory transistor as claimed in claim 1, wherein said movable gate comprises a material which is attractive to said source region and said drain region.

4. The mechanical memory transistor as claimed in claim 2, wherein said movable gate comprises a material which is attractive to said source region and said drain region.

5. A mechanical memory transistor, comprising:
   a substrate having formed thereon a source region and a drain region;
   said source region having a first source region portion and a second source region portion;
   said drain region having a first drain region portion and a second drain region portion;
   a gate oxide formed upon said first source region portion and upon said first drain region portion;
   said gate oxide not being formed upon said second source region portion;
   said gate oxide not being formed upon said second drain region portion;
   a pull up electrode positioned above said substrate such that a gap is formed between said pull up electrode and said gate oxide;
   a movable gate having a first position and a second position, said movable gate being located in said gap between said pull up electrode and said gate oxide; and
   a pull down electrode located in said source and drain regions;
   said movable gate contacting said pull up electrode when said movable gate is in said first position;
   said movable gate being moved to said first position when a voltage is applied between said pull up electrode and said movable gate;
   said movable gate remaining in said first position after the voltage being applied between said pull up electrode and said movable gate is terminated;
   said movable gate remaining in said first position until a voltage is applied between said substrate and said movable gate;
   said movable gate contacting said gate oxide when said movable gate is in said second position;
   said movable gate being moved to said second position when a voltage is applied between said pull down electrode and said movable gate;

said movable gate remaining in said second position after the voltage being applied between said substrate and said movable gate is terminated;

said movable gate remaining in said second position until the voltage is applied between said pull up electrode and said movable gate;

said movable gate, in conjunction with said source and drain regions and when said movable gate is in said second position, forming a transistor.

6. The mechanical memory transistor as claimed in claim 5, wherein said movable gate comprises a material which is attractive to said pull down electrode.

7. The mechanical memory transistor as claimed in claim 5, wherein said movable gate comprises a material which is attractive to said source region and said drain region.

8. The mechanical memory transistor as claimed in claim 6, wherein said movable gate comprises a material which is attractive to said source region and said drain region.

9. A mechanical memory transistor, comprising:

a substrate having formed thereon a first source region and a first drain region;

said substrate having formed thereon a second source region and a second drain region;

said first source region having a first source region portion and a second source region portion;

said first drain region having a first drain region portion and a second drain region portion;

said second source region having a third source region portion and a fourth source region portion;

said second drain region having a third drain region portion and a fourth drain region portion;

a first gate oxide formed upon said first source region portion and said first drain region portion;

said first gate oxide not being formed upon said second source region portion;

said first gate oxide not being formed upon said second drain region portion;

a second gate oxide formed upon said third source region portion and said third drain region portion;

said second gate oxide not being formed upon said fourth source region portion;

said second gate oxide not being formed upon said fourth drain region portion; and a movable gate having a first position and a second position, said movable gate being located in a gap above said first gate oxide, said movable gate being located in a gap above said second gate oxide;

said movable gate contacting said first gate oxide when said movable gate is in said first position;

said movable gate contacting said second gate oxide when said movable gate is in said second position;

said movable gate not contacting said first gate oxide when said movable gate is in said second position;

said movable gate not contacting said second gate oxide when said movable gate is in said first position;

said movable gate contacting said first gate oxide to form a gate region when said movable gate is in said first position;

said movable gate contacting said second gate oxide to form a gate region when said movable gate is in said second position;

said movable gate, in conjunction with said first source region and said first drain region and when said movable gate is in said first position, forming a first transistor;

said movable gate, in conjunction with said second source region and said second drain region and when said movable gate is in said second position, forming a second transistor.

10. The mechanical memory transistor as claimed in claim 9, wherein said movable gate comprises a material which is attractive to said first source/drain region.

11. The mechanical memory transistor as claimed in claim 9, wherein said movable gate comprises a material which is attractive to said second source/drain region.

12. The mechanical memory transistor as claimed in claim 11, wherein said movable gate comprises a material which is attractive to said first source/drain region.

\* \* \* \* \*